United States Patent
Val et al.

(10) Patent No.: US 8,359,740 B2
(45) Date of Patent: Jan. 29, 2013

(54) PROCESS FOR THE WAFER-SCALE FABRICATION OF ELECTRONIC MODULES FOR SURFACE MOUNTING

(75) Inventors: Christian Val, St Remy les Chevreuse (FR); Pascal Couderc, Nanterre (FR); Alexandre Val, Roquencourt (FR)

(73) Assignee: 3D Plus, Buc (FR)

( * ) Notice: Subject to any disclaimer, the term of this patent is extended or adjusted under 35 U.S.C. 154(b) by 82 days.

(21) Appl. No.: 13/140,637

(22) PCT Filed: Dec. 18, 2009

(86) PCT No.: PCT/EP2009/067530
§ 371 (c)(1),
(2), (4) Date: Jun. 17, 2011

(87) PCT Pub. No.: WO2010/070103
PCT Pub. Date: Jun. 24, 2010

(65) Prior Publication Data
US 2011/0247210 A1     Oct. 13, 2011

(30) Foreign Application Priority Data
Dec. 19, 2008  (FR) ...................................... 08 07208

(51) Int. Cl.
*H05K 3/30* (2006.01)

(52) U.S. Cl. ............................... 29/832; 29/840; 29/841

(58) Field of Classification Search .................... 29/832, 29/840, 841; 438/64
See application file for complete search history.

(56) References Cited

U.S. PATENT DOCUMENTS

| | | | |
|---|---|---|---|
| 3,816,906 A | * | 6/1974 | Falckenberg ................. 438/460 |
| 4,216,444 A | | 8/1980 | Vergnolle et al. |
| 4,408,256 A | | 10/1983 | Val |
| 4,413,170 A | | 11/1983 | Val et al. |
| 4,518,818 A | | 5/1985 | Le Ny et al. |
| 4,546,028 A | | 10/1985 | Val |
| 4,559,579 A | | 12/1985 | Val |
| 4,639,826 A | | 1/1987 | Val et al. |

(Continued)

FOREIGN PATENT DOCUMENTS

| EP | 0128079 A2 | 12/1984 |
|---|---|---|
| EP | 0490739 A1 | 6/1992 |

(Continued)

OTHER PUBLICATIONS

J. Fjelstad: "Solder-free assembly—A more environmentally friendly alternative to lead-free," Global SMT & Packaging, Sep. 2007, pp. 19-22.

*Primary Examiner* — Carl Arbes
(74) *Attorney, Agent, or Firm* — Baker & Hostetler LLP

(57) ABSTRACT

A process for the wafer-scale fabrication of CMS electronic modules starts from a wafer with metallized outputs, comprising electronic components molded in resin and, on one side, the external outputs of the electronic components on which a nonoxidizable metal or alloy is deposited, and of a printed circuit provided with oxidizable metal or alloy contact pads. In the process, the wafer is cut in predetermined patterns for obtaining reconfigured molded components that include at least one electronic component; the reconfigured components are assembled on the printed circuit, the metallized external outputs of the reconfigured components being placed opposite the metallized contact pads of the printed circuit; and these external outputs are connected solderlessly to the metallized contact pads of the printed circuit by means of a material based on an electrically conductive adhesive or ink.

7 Claims, 3 Drawing Sheets

U.S. PATENT DOCUMENTS

| | | | |
|---|---|---|---|
| 4,654,694 A | 3/1987 | Val | |
| 4,755,910 A | 7/1988 | Val | |
| 5,002,895 A | 3/1991 | LeParquier et al. | |
| 5,237,204 A | 8/1993 | Val | |
| 5,323,533 A | 6/1994 | Val | |
| 5,400,218 A | 3/1995 | Val | |
| 5,461,545 A | 10/1995 | Leroy et al. | |
| 5,526,230 A | 6/1996 | Val | |
| 5,637,536 A | 6/1997 | Val | |
| 5,640,760 A | 6/1997 | Val et al. | |
| 5,847,448 A | 12/1998 | Val et al. | |
| 5,885,850 A | 3/1999 | Val | |
| 5,897,336 A | 4/1999 | Brouilette et al. | |
| 6,307,261 B1 | 10/2001 | Val et al. | |
| 6,359,340 B1 * | 3/2002 | Lin et al. | 257/777 |
| 6,413,851 B1 | 7/2002 | Chow et al. | |
| 6,716,672 B2 | 4/2004 | Val | |
| 6,809,367 B2 | 10/2004 | Val | |
| 7,476,965 B2 | 1/2009 | Val et al. | |
| 7,485,955 B2 * | 2/2009 | Kang et al. | 257/701 |
| 7,635,639 B2 | 12/2009 | Val et al. | |
| 7,877,874 B2 | 2/2011 | Val | |
| 7,951,649 B2 | 5/2011 | Val | |
| 8,198,722 B2 * | 6/2012 | Cho et al. | 257/690 |
| 2003/0022403 A1 | 1/2003 | Shimoda et al. | |
| 2004/0038442 A1 * | 2/2004 | Kinsman | 438/64 |
| 2005/0205975 A1 * | 9/2005 | Kang et al. | 257/678 |
| 2007/0190691 A1 * | 8/2007 | Humpston et al. | 438/113 |
| 2008/0170374 A1 | 7/2008 | Val | |
| 2008/0316727 A1 | 12/2008 | Val et al. | |
| 2009/0260228 A1 | 10/2009 | Val | |
| 2010/0276081 A1 | 11/2010 | Val | |

FOREIGN PATENT DOCUMENTS

| | | |
|---|---|---|
| EP | 0497948 A1 | 8/1992 |
| EP | 0565391 A1 | 10/1993 |
| EP | 0584349 A1 | 3/1994 |
| EP | 0593330 A1 | 4/1994 |
| EP | 0638933 A1 | 2/1995 |
| EP | 0642699 A1 | 3/1995 |
| EP | 1127385 A1 | 8/2001 |
| EP | 1150552 A2 | 10/2001 |
| EP | 1916709 A1 | 4/2008 |
| FR | 2403688 A1 | 4/1979 |
| FR | 2440242 A1 | 5/1980 |
| FR | 2440615 A1 | 5/1980 |
| FR | 2456388 A1 | 12/1980 |
| FR | 2456390 A1 | 12/1980 |
| FR | 2470518 A1 | 5/1981 |
| FR | 2473214 A1 | 7/1981 |
| FR | 2475960 A1 | 8/1981 |
| FR | 2479520 A1 | 10/1981 |
| FR | 2479637 A1 | 10/1981 |
| FR | 2479639 A1 | 10/1981 |
| FR | 2485262 A1 | 12/1981 |
| FR | 2485796 A1 | 12/1981 |
| FR | 2489592 A1 | 3/1982 |
| FR | 2495837 A1 | 6/1982 |
| FR | 2496341 A1 | 6/1982 |
| FR | 2500959 A1 | 9/1982 |
| FR | 2504756 A1 | 10/1982 |
| FR | 2511193 A1 | 2/1983 |
| FR | 2511804 A1 | 2/1983 |
| FR | 2514562 A1 | 4/1983 |
| FR | 2525209 A1 | 10/1983 |
| FR | 2525815 A1 | 10/1983 |
| FR | 2527039 A1 | 11/1983 |
| FR | 2529386 A1 | 12/1983 |
| FR | 2538618 A1 | 6/1984 |
| FR | 2543394 A1 | 9/1984 |
| FR | 2547113 A1 | 12/1984 |
| FR | 2550009 A1 | 2/1985 |
| FR | 2554516 A1 | 5/1985 |
| FR | 2565032 A1 | 11/1985 |
| FR | 2584853 A1 | 1/1987 |
| FR | 2584863 A1 | 1/1987 |
| FR | 2584865 A1 | 1/1987 |
| FR | 2588770 A1 | 4/1987 |
| FR | 2591801 A1 | 6/1987 |
| FR | 2603739 A1 | 3/1988 |
| FR | 2614134 A1 | 10/1988 |
| FR | 2623615 A1 | 5/1989 |
| FR | 2627875 A1 | 9/1989 |
| FR | 2632477 A1 | 12/1989 |
| FR | 2639154 A1 | 5/1990 |
| FR | 2640846 A1 | 6/1990 |
| FR | 2645681 A1 | 10/1990 |
| FR | 2657220 A1 | 7/1991 |
| FR | 2666190 A1 | 2/1992 |
| FR | 2670323 A1 | 6/1992 |
| FR | 2673776 A1 | 9/1992 |
| FR | 2674680 A1 | 10/1992 |
| FR | 2677415 A1 | 12/1992 |
| FR | 2680284 A1 | 2/1993 |
| FR | 2688629 A1 | 9/1993 |
| FR | 2688630 A1 | 9/1993 |
| FR | 2696871 A1 | 4/1994 |
| FR | 2704690 A1 | 11/1994 |
| FR | 2706139 A1 | 12/1994 |
| FR | 2709020 A1 | 2/1995 |
| FR | 2719967 A1 | 11/1995 |
| FR | 2726151 A1 | 4/1996 |
| FR | 2726941 A1 | 5/1996 |
| FR | 2785452 A1 | 5/2000 |
| FR | 2802706 A1 | 6/2001 |
| FR | 2805082 A1 | 8/2001 |
| FR | 2812453 A1 | 2/2002 |
| FR | 2832136 A1 | 5/2003 |
| FR | 2857157 A1 | 1/2005 |
| FR | 2864342 A1 | 6/2005 |
| FR | 2875672 A1 | 3/2006 |
| FR | 2884048 A1 | 10/2006 |
| FR | 2884049 A1 | 10/2006 |
| FR | 2894070 A1 | 6/2007 |
| FR | 2895568 A1 | 6/2007 |
| FR | 2905198 A1 | 2/2008 |
| FR | 2911995 A1 | 8/2008 |
| FR | 2923081 A1 | 5/2009 |
| FR | 2940521 A1 | 6/2010 |
| FR | 2943176 A1 | 9/2010 |
| FR | 2946795 A1 | 12/2010 |
| JP | 2004-128286 A1 | 4/2004 |
| JP | 2008-244191 A | 10/2008 |
| WO | 92/03902 A1 | 3/1992 |
| WO | 93/18549 A1 | 9/1993 |
| WO | 93/24956 A1 | 12/1993 |
| WO | 00/26992 A1 | 5/2000 |
| WO | 2008/105425 A1 | 9/2008 |

* cited by examiner

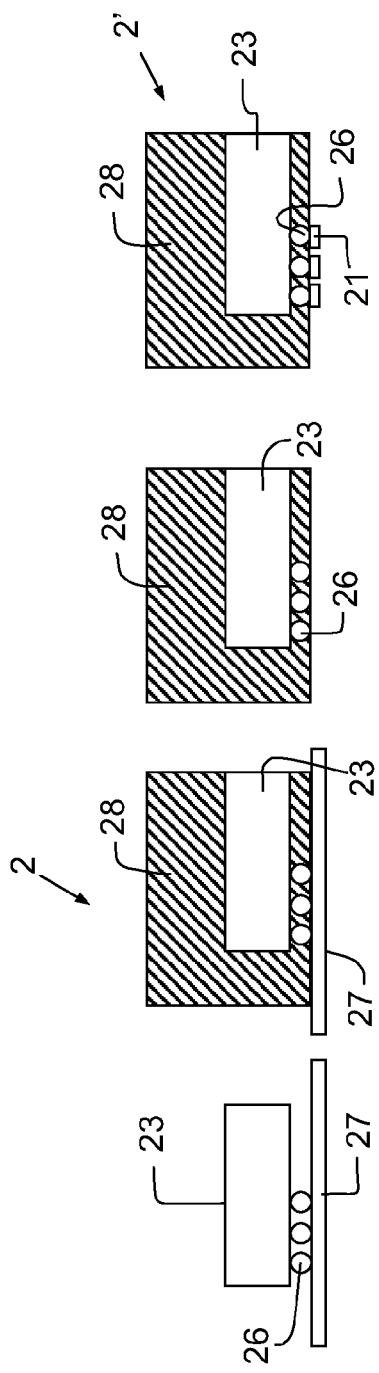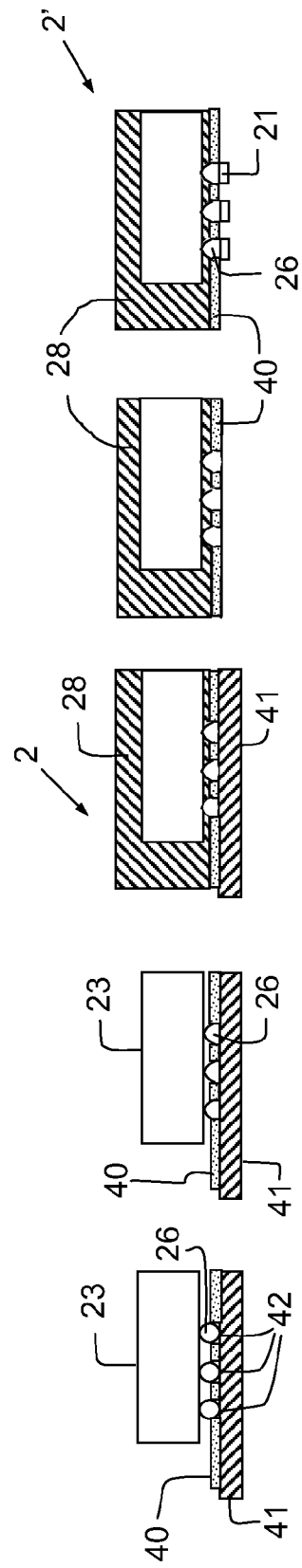

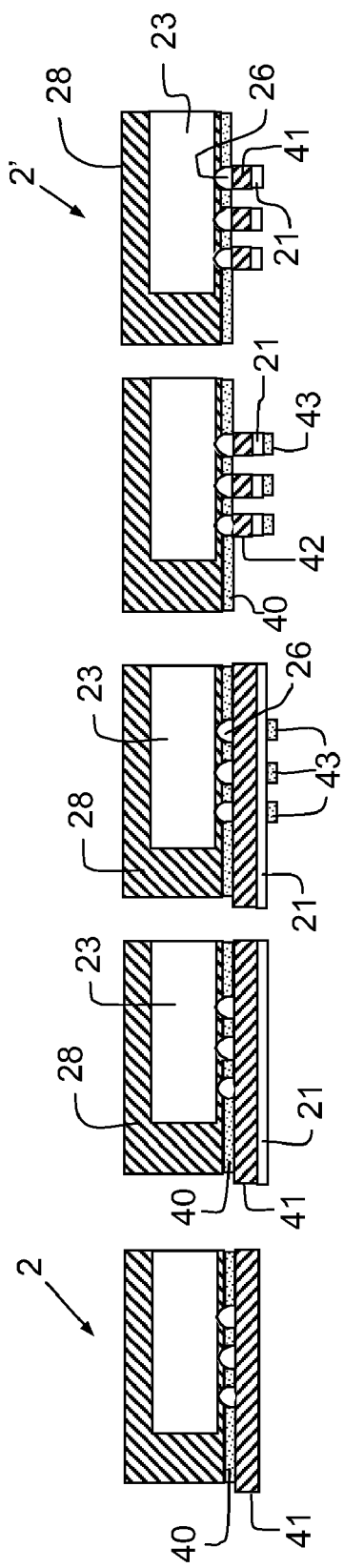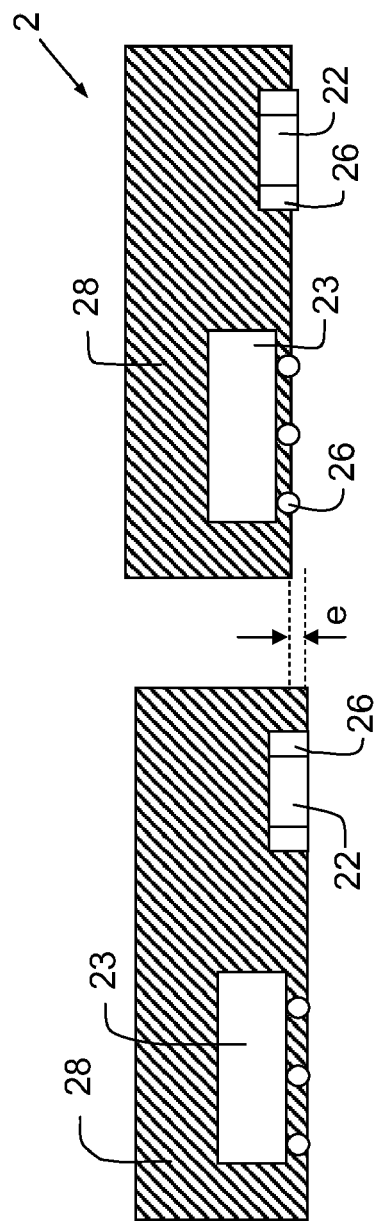

PROCESS FOR THE WAFER-SCALE FABRICATION OF ELECTRONIC MODULES FOR SURFACE MOUNTING

CROSS-REFERENCE TO RELATED APPLICATIONS

This application is a National Stage of International patent application PCT/EP2009/067530, filed on Dec. 18, 2009, which claims priority to foreign French patent application No. FR 08 07208, filed on Dec. 19, 2008, the disclosures of which are incorporated by reference in their entirety.

FIELD OF THE INVENTION

The field of the invention is that of the wafer-scale fabrication of surface-mounted electronic modules in two dimensions, also called CMS electronic modules.

BACKGROUND OF THE INVENTION

An electronic module comprises an array of electronic components connected to a printed-circuit board or PCB.

These electronic components are:

passive components 22 of the connector, capacitor, resistor, transformer or inductor type, provided with connection elements that are placed on the sides of the body of the component;

electromechanical components etched into the silicon and known by the name MEMS (Micro-ElectroMechanical systems), etc. provided with connection pads intended for surface mounting, or else:

semiconductor electronic components, otherwise called active components or "chips".

It is known to encapsulate these active components in packages provided with external outputs for these packages having dimensions generally 1.2 to 5 times larger than the bare chip, thus making it easier to be manipulated. The bare chip is connected to a substrate which is itself placed in the package, the package having its own external connection system. The encapsulation in packages makes it possible notably to carry out test procedures on the chip, thereby considerably increasing the fabrication yield of circuits on which they are mounted.

Various types of packages are known in the prior art, namely leaded packages 24 and ball grid array or BGA packages 23. These packages are intended for surface mounting on a substrate.

In certain cases, these electronic components are connected by applying solder, the solder generally consisting of a metal alloy of the tin-lead or tin-silver-copper type for example. However, for certain, mainly high-temperature applications (oil services industry, drive systems for automobiles, aircraft, etc.), soldering is not suitable. This is because the metallurgy of these alloys results in the appearance of layers of intermetallics. The growth of these intermetallics is activated by temperature (Arrhenius law). Accelerated ageing mechanisms in solders occur, resulting in their destruction (for example due to grain coarsening, to intermetallic diffusion, to the formation of brittle intermetallic compounds, etc.).

Moreover, the increase in families of components and the rarefaction of packages for a given active component give rise to a criticality in respect of package terminations. Specifically, the electronic assembly is a heterogeneous system such that, in certain cases, reliability cannot be achieved. For example, ball grid array packages based on SAC105 alloy (melting point $T_m=228°$ C.) are incompatible with packages based on tin-lead terminations ($T_m=186°$ C.) or even tin-silver-copper (SAC305).

In other cases, these electronic components are connected solderlessly to an interconnection circuit. An example of such an interconnection process is described in the patent FR 03/15034. This process comprises notably the assembly of components on a substrate, the external outputs of the components facing the substrate. This substrate may be a temporary substrate intended to be removed. The process then comprises the deposition of a resin layer on the top side of the substrate, making it possible to mold the components and ensure the mechanical retention thereof, the whole assembly thus constituted forming a wafer that may comprise a large number of components arranged in a given number of identical patterns, thus providing a wafer-scale process. The process then includes the surface treatment of the wafer for revealing, on a substantially planar connection surface, the external outputs of the components. These outputs are then connected together according to a predetermined electrical connection scheme, for example by photoetching a metal layer. Several metallization levels may be produced if the routing cannot be accomplished on a single level. This multilevel or multilayer interconnection circuit is constructed on the wafer—there is no PCB circuit. In the case of a wafer-scale process, the wafer is finally diced in patterns for producing as many electronic devices able to withstand high temperature. This process does, however, have the following drawbacks: the interconnection complexity is limited as it is difficult to produce a circuit consisting of more than four layers by an additive deposition technique. In addition, it is impossible to repair a wafer comprising defective molded components.

According to a known variant illustrated in FIG. 1, the fabrication of the wafer 2' is decoupled from the fabrication of a PCB circuit 1. These are then connected together by means of a silver-based epoxy adhesive 10. However, it is known that the bonding of "tinned" components, such as the external outputs 26, gives rise to wet thermal oxidation that may result in an insulating interface between the tin-based external output 26 (lead, ball, etc.) and the silver-based adhesive 10. To remedy this, it is known that it is necessary to bond to nonoxidizable metals. This is why, before connection, the external outputs 26 of the wafer are covered with a barely oxidizable or nonoxidizable metal or alloy 21, such as gold, and also the contact pads of the PCB circuit (metallized contact pads 11) intended to be connected to the external outputs. This embodiment makes it possible to use a standard PCB circuit but it is not always possible to repair defective molded components in a wafer.

SUMMARY OF THE INVENTION

Consequently, there remains at the present time a need for a process for the wafer-scale fabrication of CMS electronic modules that simultaneously satisfies all the aforementioned requirements, namely solderless connection, use of a PCB circuit and the possibility of repairing defective molded components in a wafer.

More precisely, the subject of the invention is a process for the wafer-scale fabrication of CMS electronic modules starting from a wafer with metallized outputs, comprising on a first side electronic components molded in resin and, on the opposite side, the external outputs of the electronic components on which a nonoxidizable metal or alloy is deposited, and of a printed circuit provided with oxidizable metal or alloy contact pads. It is mainly characterized in that it comprises the following steps:

the wafer is cut in predetermined patterns for obtaining reconfigured molded components but include at least one electronic component;

the reconfigured components are assembled on the printed circuit, the metallized external outputs of the reconfigured components being placed opposite the metallized contact pads of the printed circuit;

these external outputs are connected solderlessly to the metallized contact pads of the printed circuit by means of a material based on an electrically conductive adhesive or ink.

This process offers the possibility of repairing any defective reconfigured component, the reconfigured components being obtained from a wafer.

The wafer having metallized outputs may be obtained by wafer-scale fabrication in various ways.

According to a first method of implementation, said wafer is obtained according to the following steps:

the electronic components are assembled on that side of a temporary substrate, such as the adhesive side of a bonding skin, called the top side, the external outputs facing this top side;

a layer of resin is deposited on the top side, in order to mold the components and thus obtain a wafer;

the temporary substrate is removed;

the bottom side of the wafer, opposite the top side, undergoes a surface treatment until the external outputs of the electronic components appear and a planar surface is thus obtained;

the barely oxidizable or nonoxidizable metal or alloy is deposited only on these outputs by masking or the metal or alloy is deposited on this planar surface and the metal or alloy beyond the external outputs is removed by chemical etching or by laser ablation or by sandblasting.

According to an alternative embodiment, said wafer is obtained according to the following steps:

a lacquer is deposited on the top side of a copper plate except on areas intended to receive the external outputs of the electronic components;

the electronic components are assembled on the top side of this plate so as to make the external outputs coincide with these lacquer-free areas and these outputs are soldered to the copper plate;

a layer of resin is deposited on the top side in order to mold, possibly partially, the components and thus obtain a wafer;

the copper is removed by dissolving it, so as in this way to expose the external outputs of the electronic components on a planar surface;

the barely oxidizable or nonoxidizable metal or alloy is deposited only on the external outputs by masking or the metal or alloy is deposited on this planar surface and the metal or alloy beyond the external outputs is removed by chemical etching or by laser ablation or by sandblasting.

According to another method of implementation, said wafer is obtained according to the following steps:

a lacquer is deposited on the top side of a copper plate except on areas intended to receive the external outputs of the electronic components;

the electronic components are assembled on the top side of this plate so as to make the external outputs coincide with these lacquer-free areas, and these outputs are soldered to the copper plate;

a layer of resin is deposited on the top side in order to mold, possibly partially, the components and thus obtain a wafer;

the barely oxidizable or nonoxidizable metal or alloy is deposited on the opposite side, called the underside, of the copper plate;

a lacquer is deposited on the metal or alloy in areas located vertically below the external outputs;

the metal or alloy and copper are removed beyond these areas so as to expose the lacquered metallized outputs;

the lacquer is removed from these areas, that is to say these lacquered outputs, so as to obtain metallized outputs.

According to a third method of implementation, said wafer is obtained according to the following steps:

the electronic components are assembled on that side of a temporary substrate, such as the adhesive face of a bonding skin, called the top side, the external outputs facing this top side;

a layer of resin is deposited on the top side in order to mold, possibly partially, the components and thus obtain a wafer;

the temporary substrate is removed;

the underside of the wafer, opposite the top side, is etched by means of a plasma in order to expose the external outputs;

the barely oxidizable or nonoxidizable metal or alloy is deposited only on these outputs by masking or the metal or alloy is deposited on this planar surface and the metal or alloy beyond the external outputs is removed by chemical etching or by laser ablation or by sandblasting.

According to another method of implementation, this final deposition step is replaced by the following steps:

a metal seed layer is deposited over the entire underside;

a layer of photoresist which will be photoetched in line with each external output is deposited;

nickel or gold, deposited electrochemically by virtue of the seed layer, is selectively deposited;

the layer of photoresist and the seed layer are dissolved.

BRIEF DESCRIPTION OF THE DRAWINGS

Other features and advantages of the invention will become apparent on reading the following detailed description, given by way of nonlimiting example and with reference to the appended drawings in which:

FIG. 3 schematically illustrate a first embodiment of a wafer having metallized external outputs;

FIG. 4 schematically illustrate a second embodiment of a wafer having metallized external outputs;

FIG. 5 schematically illustrate a third embodiment of a wafer having metallized external outputs; and FIG. 6 schematically illustrate a fourth embodiment of a wafer having metallized external outputs.

From one figure to the other, identical elements are identified by the same references.

DETAILED DESCRIPTION

Figure 2:
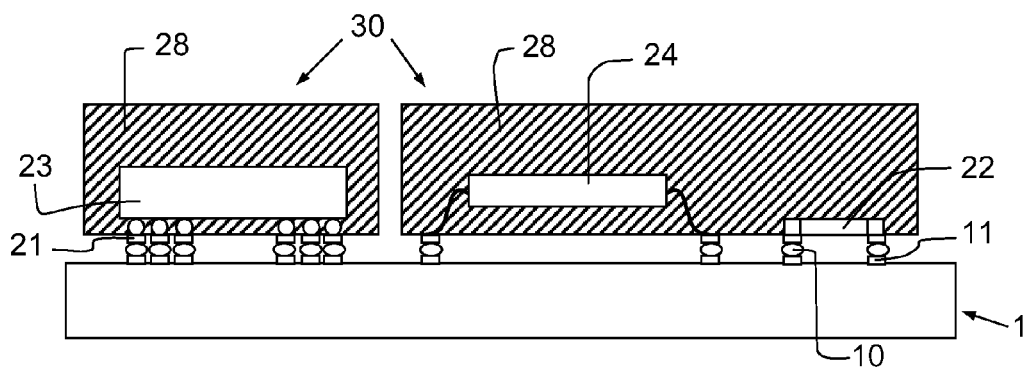
FIG. 2 shows schematically reconfigured components connected to a PCB circuit according to the invention.

The electronic modules are produced from a PCB circuit 1 having metallized contact pads 11 and a wafer 2' having metallized external outputs, as shown in FIG. 2.

The wafer 2' comprises leaded packages 24 and/or ball grid array packages 23 and/or passive components 22 and/or MEMS, denoted by the term "electronic components", which are molded in resin 28. Appearing on one side of the wafer are the external outputs 26 of these components, on which outputs a barely oxidizable or nonoxidizable metal or alloy 21, such as gold or a gold layer on a nickel layer, is deposited.

The PCB circuit 1 generally comprises several layers (or levels) of routing tracks stacked one on top of another, the links between the tracks of the various layers being provided by metallized vias. The top layer intended to receive the electronic components further includes contact pads intended to be connected to the external outputs of the components. As in the case of the external outputs, these contact pads are covered with a barely oxidizable or nonoxidizable metal or alloy such as gold or a gold layer on a nickel layer. Connection elements 10 (for example conductive adhesive or ink) are deposited on the metallized contact pads 11 for connecting them to the metallized external outputs.

According to the invention, the wafer 2' having metallized external outputs is diced into a plurality of parts called unitary or multiple reconfigured components 30, depending on whether they comprise one or a plurality of electronic components 22, 23, 24. These reconfigured components 30, which are molded components having metallized external outputs, are then assembled on the PCB circuit 1 and connected by bonding, for example as illustrated in FIG. 2. What is therefore obtained is a CMS electronic module capable of carrying out a complete electronic function, any defective reconfigured components of which may be repaired. To do this, all that is necessary is to debond the defective reconfigured component in order to repair it.

The solderless connection is achieved by bonding using a cured, or more precisely crosslinked, silver-based epoxy thermosetting adhesive 10 or a thermoplastic adhesive based on nonoxidizable metal particles. The connection may also be obtained by sintering an ink containing silver nanoparticles. Sintering is the consolidation of a material, obtained by supplying energy, without going as far as melting it. In this case, the material is ink that contains silver nanoparticles. Due to the effect of this energy, the nanoparticles are welded together and thus form a mechanical and electrical link. In this case, the ink is deposited on the contact pads of the PCB circuit.

The concept of a reconfigured plastic package (in general, a package contains an electronic chip), i.e. comprising gold-plated contact pads and able to be bonded to a standard printed circuit, is extremely advantageous. Bonding by means of an electrically conducting adhesive or ink makes it possible for these reconfigured packages to be electrically bonded to the printed circuit at low temperature (at around 100° C.).

The advantages on manufacturing lines currently used throughout the world, relating to practically all electronic cards, are the following:

the reliability of the printed circuits is not known with lead-free solders are used, since the solder reflow temperature has been increased by 30 to 40° C.

equipment manufacturers producing sensitive electronic cards such as for the defense, aeronautical and automotive fields, are obliged to maintain the solder reflow temperature at the level that existed before the advent of lead-free solders so as not to modify the reliability of said cards. This leads equipment manufacturers to use the old type of solder containing tin and lead (183° C. melting point) with components having lead-free solders. This approach could be acceptable after trials for redefining the reliability of soldered joints but the composition of the lead-free solders used on packages frequently changes. The reason is given by the telephone industry, which modifies the composition of lead-free solders so as to meet its own requirements. Since the requirements relate predominantly to the integrity of soldered joints during telephone impact testing (drop tests), many ternary alloys grouped together in the "SAC" family, i.e. containing tin, silver and copper, have been developed, as have novel quaternary alloys, yet in no case are these optimized for improving the reliability of solder joints.

Thus, equipment manufacturers wishing to guarantee a certain level of reliability cannot do so;

all surface-mounted equipment can be used without modification;

screen-printing of adhesive, instead of the conventional solder paste;

automatic transfer of reconfigured components exactly like standard components;

curing oven identical to the reflow oven used for solder paste, but at lower temperature, for example 100° C. instead of 250-260° C. for lead-free solders.

For all these reasons, the bonding of reconfigured packages so as to have gold-plated contact pads on printed circuits, which already have gold-plated contact pads, results in a reliable manufacturing procedure, (even one more reliable since the printed circuits experienced only a very low temperature compared with that experienced on a standard production line using lead, i.e. 220° C.) while still using the major industrial means already existing.

The wafer 2' having metallized external outputs may be obtained in various ways.

According to a first method of implementation described in relation to FIG. 3, the production of the wafer 2' comprises the following steps:

the electronic components (packages 23, 24 and MEMS or passive components 22) are assembled on the top side of a temporary substrate such as the bonding surface of an adhesive sheet 27, also called a bonding skin (FIG. 3a);

a layer of resin 28 is deposited on the top side, in order to mold the components 22, 23, 24 and ensure mutual mechanical retention of the components (FIG. 3b). For example, an epoxy resin (naturally cured) is deposited, if necessary at high temperature, on top of these components so as to cover them (possibly partially) and to form a wafer 2 that may comprise a given number of identical patterns;

the temporary substrate 27 is removed (FIG. 3c), for example by peeling, so as to expose the end of all of the external outputs 26 that appear (leads, balls or contact pads of all the surface-transferred components);

the connections undergo a polishing surface treatment so as to "refresh" them, eliminating any oxide, sulfide or chloride layers, so as to expose a larger connection area when the external outputs are balls;

the barely oxidizable or nonoxidizable metal or alloy 21 is deposited only on these external outputs 26 (FIG. 3d), by liquid, gaseous or solid-state processing, on this planar surface and the metal or alloy beyond the external outputs is removed by chemical etching or by laser ablation or by sandblasting.

Figure 1:
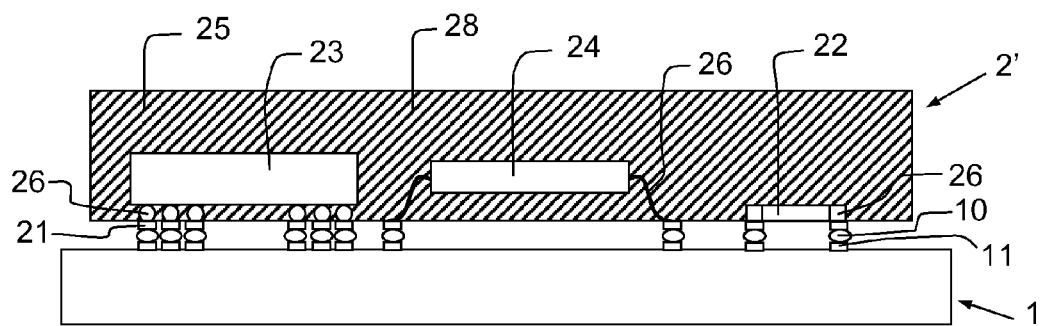
FIG. 1 shows schematically a wafer connected to a PCB circuit according to the prior art.

This first embodiment has drawbacks when there are passive components 22 among the components surface-transferred onto the bonding skin. This is because during surface treatment, a passive component is damaged since, owing to its geometric configuration shown in FIGS. 1 and 2, the body of the component 22 which is in contact with the bonding skin is also polished. The following embodiments make it possible to maintain the integrity of the passive components.

According to a second embodiment described in relation to FIG. 4, the production of the wafer 2' comprises the following steps:

a lacquer 40 having a thickness of between 25 and 100 µm is deposited on a copper plate 41 except on areas 42 intended to receive the external outputs of the electronic components;

the electronic components 22, 23, 24 are transferred onto this copper plate 41 (FIG. 4a) so as to make the external outputs 26 coincide with these lacquer-free areas 42, and these outputs 26 are soldered (FIG. 4b) to the copper plate 41 by means of a solder paste. During this soldering operation, the balls melt so that the surface area of the ball in contact with the copper is virtually that of its diametral cross section, i.e. about 200 µm;

a layer of resin 28 is deposited on this lacquered copper plate (FIG. 4c) in order to mold the components and ensure mutual mechanical retention of the components. This involves for example deposition of an epoxy resin (naturally cured), if necessary at high temperature, to be carried out above these components so as to cover them, possibly partially, and to form a wafer that may comprise a given number of identical patterns;

the copper 41 is removed by dissolving it (FIG. 4d); and the barely oxidizable or nonoxidizable metal or alloy 21 is deposited on the external outputs (FIG. 4e), by liquid, gaseous or solid-state processing, exposing only these outputs 26, or said metal or alloy is deposited over the entire planar surface, and the metal or alloy beyond the external outputs is removed by chemical etching or by laser ablation or by sandblasting.

According to a third embodiment described in relation to FIG. 5, the production of the wafer 2' comprises the following steps:

a lacquer 40 having a thickness of between 25 and 100 µm is deposited on a copper plate 41, except on areas 42 intended to receive the external outputs of the electronic components;

the electronic components 22, 23, 24 are assembled on this copper plate 41 (on the lacquered side) so as to make the external outputs 26 coincide with these lacquer-free areas 42, and these outputs 26 are soldered to the copper plate by means of solder paste, as in the case of the preceding embodiment, and as illustrated in FIGS. 4a and 4b;

a layer of resin 28 is deposited on this lacquered copper plate in order to mold the components and ensure the mutual mechanical retention of the components, as in the previous embodiment, and as illustrated in FIG. 5a;

the barely oxidizable or nonoxidizable metal or alloy 21 is deposited on the copper over the entire face of this copper plate 41 (FIG. 5b), a lacquer 43, which may or may not be photo-etchable, is deposited on the metal or alloy in areas vertically below the external outputs 26 so as to protect them during the next step (FIG. 5c);

the metal or alloy 21 and the copper 41 beyond these protected areas are removed, for example by dissolving them, so as to expose the lacquered metallized outputs that make up, at this stage, a stack consisting of copper, barely oxidizable or nonoxidizable metal or alloy and lacquer on the external outputs (FIG. 5d);

the lacquer 43 is removed from these areas, that is to say these lacquered outputs, for example by chemically dissolving it so as to obtain metallized outputs (FIG. 5e) that comprise a stack consisting of copper 41 and barely oxidizable or nonoxidizable metal or alloy 21 on the original external outputs 26.

According to a fourth embodiment described in relation to FIG. 6, the production of the wafer 2' comprises the following steps:

the electronic components are assembled on one side of a temporary substrate, such as the adhesive side of a bonding skin, called the top side, as FIG. 3a illustrates;

a layer of resin is deposited on this top side, as illustrated in FIG. 3b, in order to mold the components and ensure mutual mechanical retention of the components, as in the previous embodiment;

the temporary substrate is removed, as illustrated in FIG. 3c, for example by peeling, so as to expose the end of all the external outputs that appear (leads, balls or contact pads of all the surface-mounted components);

that side left free by removal of the temporary substrate is etched by means of a plasma (FIG. 6a), such as that of an oxygen/fluorocarbon ($O_2/CF_4$) mixture, in order to expose the external outputs 26 of the resin 28 over a thickness e of between 10 and 100 µm. The plasma etches the epoxy resin 28 and the silica beads in this resin, but does not etch the metals of the balls, leads and contact pads of the passive components (FIG. 6b);

a barely oxidizable or nonoxidizable metal or alloy 21 is deposited only on these outputs 26, as illustrated in FIG. 3d, by masking or the metal or alloy is deposited on this planar surface, and the metal or alloy beyond the external outputs is removed by chemical etching or by laser ablation or by sandblasting.

According to a fifth embodiment, the production of the wafer 2' comprises the same steps as those described in the case of the fourth embodiment, the final metal deposition step being replaced by the following steps:

a metal seed layer is deposited over the entire underside;

a layer of photoresist, which will be photo-etched in line with each external output 26, is deposited;

nickel or gold, which is produced by electrochemical deposition by virtue of the seed layer, is selectively deposited;

the layer of photoresist, i.e. the layer of photo-etchable resin, is then dissolved, as is the seed layer.

The invention claimed is:

1. A process for the wafer-scale fabrication of CMS electronic modules starting from a wafer with metallized outputs, comprising electronic components molded in resin and, on one side, the external outputs of the electronic components on which a nonoxidizable metal or alloy is deposited, and of a printed circuit provided with oxidizable metal or alloy contact pads, the process comprising:
    cutting the wafer in predetermined patterns for obtaining reconfigured molded components that include at least one electronic component;
    assembling the reconfigured components on the printed circuit, the metallized external outputs of the reconfigured components being placed opposite the metallized contact pads of the printed circuit; and
    connecting these external outputs solderlessly to the metallized contact pads of the printed circuit by means of a material based on an electrically conductive adhesive or ink.

2. The process according to claim 1, further comprising obtaining the wafer having metallized outputs according to the following steps:
    assembling the electronic components on that side of a temporary substrate called the top side, the external outputs facing this top side;
    depositing a layer of resin on the top side, in order to mold the components and thus obtain a wafer;
    removing the temporary substrate;
    performing a surface treatment to the bottom side of the wafer, opposite the top side until the external outputs of the electronic components appear and a planar surface is thus obtained; and
    depositing the nonoxidizable metal or alloy only on these outputs by masking or depositing the metal or alloy on this planar surface and removing the metal or alloy beyond the external outputs by chemical etching or by laser ablation or by sandblasting.

3. The process according to claim 1, further comprising obtaining the wafer having metallized outputs according to the following steps:
- depositing a lacquer on the top side of a copper plate except on areas intended to receive the external outputs of the electronic components;
- assembling the electronic components on the top side of this plate so as to make the external outputs coincide with these lacquer-free areas and soldering the outputs to the copper plate;
- depositing a layer of resin on the top side in order to mold the components and thus obtain a wafer;
- removing the copper by dissolving it, so as in this way to expose the external outputs of the electronic components on a planar surface;
- depositing the nonoxidizable metal or alloy only on the external outputs by masking or depositing the metal or alloy on this planar surface and removing the metal or alloy beyond the external outputs by chemical etching or by laser ablation or by sandblasting.

4. The process according to claim 1, further comprising obtaining the wafer having metallized outputs according to the following steps:
- depositing a lacquer on the top side of a copper plate except on areas intended to receive the external outputs of the electronic components;
- assembling the electronic components on the top side of this plate so as to make the external outputs coincide with these lacquer-free areas, and soldering the outputs to the copper plate;
- depositing a layer of resin on the top side in order to mold the components and thus obtain a wafer;
- depositing the nonoxidizable metal or alloy on the opposite side, called the underside, of the copper plate;
- depositing a lacquer on the metal by screen printing in areas located vertically below the external outputs;
- removing the metal or alloy and copper beyond these areas so as to expose the lacquered metallized outputs;
- removing the lacquer from these areas, that is to say these lacquered outputs, so as to obtain metallized outputs.

5. The process according to claim 1, further comprising obtaining the wafer having metallized outputs according to the following steps:
- assembling the electronic components on that side of a temporary substrate called the top side, the external outputs facing this top side;
- depositing a layer of resin on the top side in order to mold the components and thus obtain a wafer,
- removing the temporary substrate;
- etching the underside of the wafer, opposite the top side, by means of a plasma in order to expose the external outputs;
- depositing the nonoxidizable metal or alloy only on the outputs by masking or depositing the metal or alloy on this planar surface and removing the metal or alloy beyond the external outputs by chemical etching or by laser ablation or by sandblasting.

6. The process according to claim 1, further comprising obtaining the wafer having metallized outputs is obtained according to the following steps:
- assembling the electronic components on that side of a temporary substrate called the top side, the external outputs facing this top side;
- depositing a layer of resin on the top side in order to mold the components and thus obtain a wafer,
- removing the temporary substrate;
- etching the underside of the wafer, opposite the top side, by means of a plasma in order to expose the external outputs;
- depositing a metal seed layer over the entire underside;
- depositing a layer of photoresist which will be photoetched in line with each output;
- selectively depositing nickel or gold, produced by electrochemical deposition by virtue of the seed layer;
- dissolving the layer of photoresist and the seed layer.

7. The process according to claim 1, wherein the nonoxidizable metal or alloy is gold or a layer of gold on a nickel layer.

* * * * *